Sept. 15, 1970 G. LEONARD 3,529,073

FLAT-PACK SUB-ASSEMBLY FOR INTEGRATED CIRCUITS AND A METHOD FOR MAKING SAME

Filed May 8, 1968

INVENTOR.
GEORGE LEONARD

BY
Popper, Bain + Bobis
ATTORNEYS

United States Patent Office 3,529,073

Patented Sept. 15, 1970

3,529,073

FLAT-PACK SUB-ASSEMBLY FOR INTEGRATED CIRCUITS AND A METHOD FOR MAKING SAME

George Leonard, Spring Valley, N.Y., assignor to Alpha Metals, Inc., Jersey City, N.J., a corporation of New Jersey Filed May 8, 1968, Ser. No. 727,393
Int. Cl. H05k 7/02
U.S. Cl. 174—52 4 Claims

ABSTRACT OF THE DISCLOSURE

A method for making an integrated circuit module in which the lead frame has the inner ends of the leads as well as the outer ends of the leads interconnected until the lead frame is secured to the module, after which the interconnection on the inner end of the leads is broken away.

A lead frame for a module for integrated circuit flat-pack which has the inner ends of the leads all interconnected by an integral strip which can be broken off at a score line after the lead frame is attached to the module.

FIELD OF INVENTION

This invention relates generally to a method for making an integrated circuit flat-pack having a plurality of leads attached thereto, and specifically to a construction for a comb of leads that permits precise positioning of the leads in the module. The invention also relates to a method for affixing leads in a module.

DESCRIPTION OF THE PRIOR ART

Lead frames or combs of leads are in common use in the formation of integrated circuits known as flat-packs. A plurality of leads interconnected together at one end are introduced with their free ends inserted into a module or flat-pack with their outer ends outside of the flat-pack. The inner ends of the leads are often deformed out of their normal position and are not equally spaced from each other. When this occurs, the flat-pack must be discarded because in the small work space provided in the flat-pack, tolerances are exceedingly small and the ends of the leads must all lie in the same plane and they should be precisely the same length.

Due to the high degree of waste resulting from the discarding of flat-packs where the leads are deformed, the integrated circuit flat-pack has not won the degree of acceptance that might be expected.

SUMMARY OF THE INVENTION

A means has been found for applying a lead frame to a flat-pack in such a manner that the leads will all be of the same length, will lie in the same plane, and will be equally spaced from each other and free of deformation. This is accomplished by forming the lead frame without free ends on the leads but rather leaving all of the leads interconnected by a connecting strip. A score line at the point of juncture between the lead and the connecting strip provides a convenient break-away point after the lead frame is attached to the flat-pack. In this manner, a lead frame can be prepared wherein the leads will be spaced a predetermined distance from each other and such a lead frame can be attached to the flat-pack with the leads protruding therein the desired distance. In this manner, the leads are precisely positioned in the module.

DRAWINGS

These objects and advantages as well as other objects and advantages may be attained by the device shown by way of illustration in the drawings in which FIG. 1 is a side elevational view of a comb of leads with an interconnecting strip;

DESCRIPTION OF PREFERRED EMBODIMENT

A lead frame 11 is prepared of some conductive metal such as copper, silver, Kovar, or other well-known alloy which has a coefficient of thermal expansion and contraction which is not incompatible with the ceramic or other material of which the flat-pack is formed. The lead frame has an outer connecting strip 12 from which a plurality of leads or teeth 13 extend. There is also an inner connecting strip 14.

Figure 1:
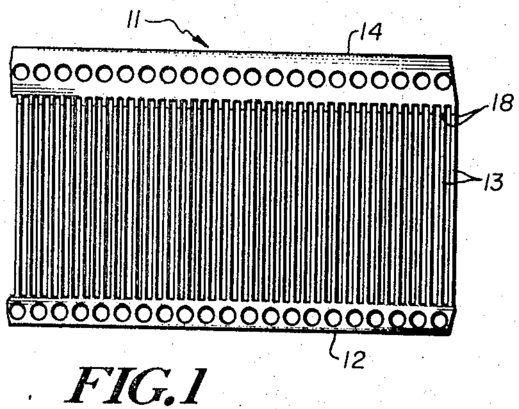
Figure 2:
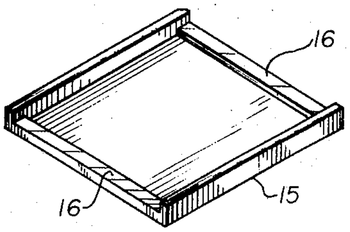
FIG. 2 is a perspective view of a ceramic base for a module (a flat-pack) before the lead frame is applied.
Figure 3:
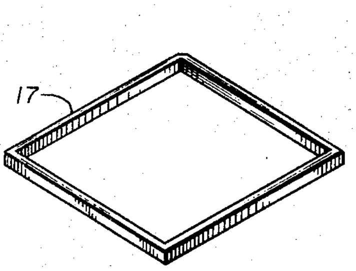
FIG. 3 is a perspective view of a ceramic retainer for the lead frame before it is applied to the flat-pack base.
Figure 4:
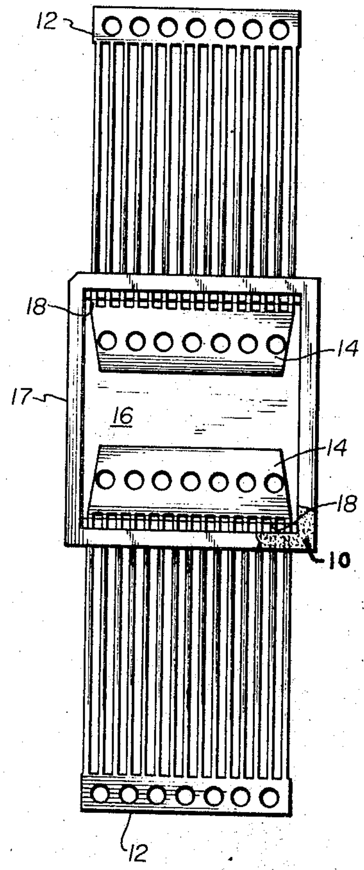
FIG. 4 is a top plan view of the base to which two combs of leads are applied, showing the score line for the break-off of the lead frame.

A ceramic base 15 for a flat-pack is provided. It has one or two seats upon which there is positioned a lead frame or comb of leads 11. The frame 11 is positioned on the base 15 with the inner connecting strip within the base and the ends of the leads 13 protruding into the cavity 16 in the base 15 sufficient to enable the connection to be applied thereto (see FIG. 4).

Figure 6:
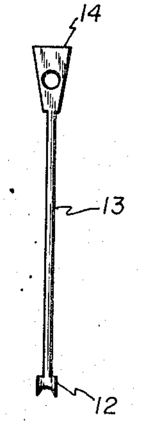
FIG. 6 is a lead having trimmed ends for convenience in connection.
Figure 5:
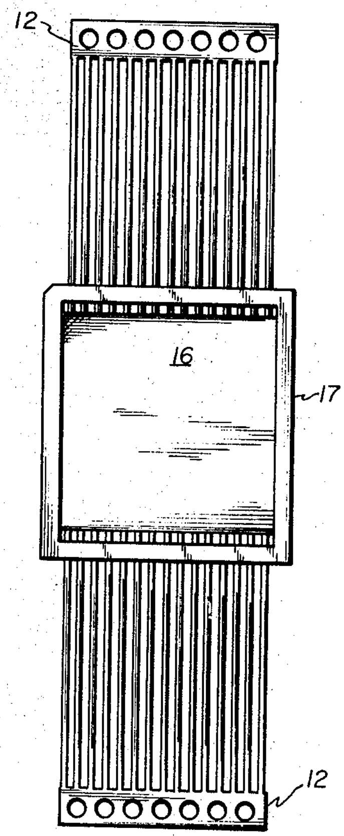
FIG. 5 is a top plan view of the module after the break-off of the interconnecting strip.

A cement 10 is then applied over the frame 11 and a ceramic retainer 17 in the form of a rectangular open frame is applied to the base 15. When the cement is set and the frame 11 and retainer are firmly attached to the base 15, the interconnecting strip 14 may be broken off on the score lines 18. If, instead of a cement, a ceramic slip is applied, the slip may be cured in the usual manner and it will bond the frame in place. The leads 13 may have their ends trimmed in accordance with FIG. 6 to provide a conveniently shaped terminal for connections to be applied.

In this manner, the leads inside the module are positioned with a high degree of precision; they will not be deformed during attachment to the flat-pack. Due to the smallness of the work space, such precision is important. Leads affixed to the flat-pack in this manner will be all exactly the same length and precisely spaced from each other, with the ends of the leads all lying in the same plane, when the interconnecting strip is broken away. Waste of flat-packs due to the necessity for discarding defective ones, is reduced to a minimum and the more generalized use of flat-pack modules becomes economically practicable.

The foregoing description is merely intended to illustrate an embodiment of hte invention. The component parts have been shown and described. They each have substitutes which may perform a substantially similar function; such substitutes may be known as proper substitutes for the said components and may have actually been known or invented before the present invention.

What is claimed is:

1. A method for applying leads to a flat-pack comprising (a) preparing a module having a cavity therein, (b) preparing a lead frame with inner ends of the leads interconnected, (c) providing a score line defining a break-off point, the inner end of each lead in the cavity of the module, and a remainder of the lead after break-off being sufficient to permit a connection to be made thereto, (d) affixing the lead frame to the module with the inner interconnected ends of the leads disposed in the cavity in the module, (e) breaking off the interconnection of the inner ends of the leads at each score line to provide coplanar, free, separate inner ends of the leads.

2. The method of claim 1 and including the steps of (a) providing the outer ends of the lead frame with an interconnection outside the module, (b) providing a score line, defining a break-off point, on the outer ends of each of the leads outside the module, (c) breaking off the interconnection of the outer ends of the leads at the score lines outside the module.

3. A flat-pack sub-assembly comprising (a) a module having a cavity therein, (b) a lead frame having a plurality of leads with the inner ends positioned in the cavity in the module, (c) an integral inner connecting strip on the inner ends of the leads, (d) a score line defining a break-off point, applied to each of the leads, with sufficient remainder from the break-off point within the cavity to permit a connection to be made thereto.

4. The device according to claim 3 and (a) outer ends of the leads extending outside the module, (b) an integral outer connecting strip on the outer ends of the leads, (c) a score line defining a break-off point on the outer ends of each of the leads outside the module.

References Cited

UNITED STATES PATENTS 3,262,022 7/1966 Caracciolo.

DARRELL L. CLAY, Primary Examiner

U.S. Cl. X.R.

29—193.5, 589, 624; 317—234